(12) United States Patent
Avci et al.

(10) Patent No.: US 11,322,504 B2
(45) Date of Patent: May 3, 2022

(54) FERROELECTRIC-CAPACITOR INTEGRATION USING NOVEL MULTI-METAL-LEVEL INTERCONNECT WITH REPLACED DIELECTRIC FOR ULTRA-DENSE EMBEDDED SRAM IN STATE-OF-THE-ART CMOS TECHNOLOGY

(71) Applicant: Intel Corporation, Santa Clara, CA (US)

(72) Inventors: Uygar Avci, Portland, OR (US); Daniel Morris, Hillsboro, OR (US); Seiyon Kim, Portland, OR (US); Yih Wang, Portland, OR (US); Ruth Brain, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 795 days.

(21) Appl. No.: 16/021,019

(22) Filed: Jun. 28, 2018

(65) Prior Publication Data

US 2020/0006352 A1 Jan. 2, 2020

(51) Int. Cl.
*H01L 27/11502* (2017.01)
*H01L 27/11* (2006.01)
(Continued)

(52) U.S. Cl.
CPC .. *H01L 27/11502* (2013.01); *H01L 21/31116* (2013.01); *H01L 21/31144* (2013.01); *H01L 21/76802* (2013.01); *H01L 21/76831* (2013.01); *H01L 21/76877* (2013.01); *H01L 23/528* (2013.01); *H01L 23/5223* (2013.01); *H01L 27/1104* (2013.01); *H01L 28/60* (2013.01)

(58) Field of Classification Search
CPC ......... H01L 21/31116; H01L 21/31144; H01L 21/768; H01L 21/76802; H01L 21/76831; H01L 21/76832; H01L 21/76834; H01L 21/76877; H01L 21/8239; H01L 23/5222; H01L 23/5223; H01L 23/528; H01L 27/1104; H01L 27/115; H01L 27/11502; H01L 27/11507; H01L 28/40; H01L 28/55; H01L 28/57; H01L 28/60; H01L 28/75
See application file for complete search history.

(56) References Cited

U.S. PATENT DOCUMENTS

2007/0284636 A1* 12/2007 Noma .............. H01L 27/11502
257/295

* cited by examiner

*Primary Examiner* — Cheung Lee
(74) *Attorney, Agent, or Firm* — Schwabe, Williamson & Wyatt, P.C.

(57) ABSTRACT

Embodiments include a memory array and a method of forming the memory array. A memory array includes a first dielectric over first metal traces, where first metal traces extend along a first direction, second metal traces on the first dielectric, where second metal traces extend along a second direction perpendicular to the first direction, and third metal traces on the second dielectric, where third metal traces extend along the first direction. The memory array includes a ferroelectric capacitor positioned in a trench having sidewalls and bottom surface, where the trench has a depth defined from a top surface of first metal trace to the top surface of third metal trace. The memory array further includes an insulating sidewall, a first electrode, a ferroelectric, and a second electrode disposed in the trench, where the trench has a rectangular cylinder shape defined by the first, second, and third metal traces.

25 Claims, 5 Drawing Sheets

(51) Int. Cl.
*H01L 23/528* (2006.01)
*H01L 23/522* (2006.01)
*H01L 49/02* (2006.01)
*H01L 21/768* (2006.01)
*H01L 21/311* (2006.01)

FERROELECTRIC-CAPACITOR INTEGRATION USING NOVEL MULTI-METAL-LEVEL INTERCONNECT WITH REPLACED DIELECTRIC FOR ULTRA-DENSE EMBEDDED SRAM IN STATE-OF-THE-ART CMOS TECHNOLOGY

FIELD

Embodiments relate to semiconductor structures and processing. More particularly, the embodiments relate to complementary metal-oxide-semiconductor (CMOS) technology implemented with ferroelectric-capacitor integration, using a multi-metal-level (MML) interconnect with replaced dielectric for ultra-dense embedded static random-access memory (SRAM).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The drive to scale integrated circuits, such as microprocessors, has been obtained through the use of 6 transistor static random-access memory (SRAM) (6T-SRAM). The formation of such 6T-SRAM cell requires that the cell be increasingly fast and easily integratable with logic transistors. The performance of SRAM, however, can be limited due to poor density, high leakage power, and/or high sensitivity to variation. This limits the on-die cache size and thus limits the overall microprocessor performance.

Existing packaging solutions may implement a standard 6T SRAM, an off-chip high density memory (e.g., a commodity high bandwidth memory (HBM) dynamic random access memory (DRAM) (HBM DRAM), or a non-volatile memory (e.g., a resistance RAM (ReRAM)), or a conventional embedded-DRAM (eDRAM). These existing packaging solutions nevertheless have limitations and problems.

With respect to the standard 6T-SRAM, this SRAM limits the amount of memory that can be put in a standard chip area. Due to the large unit-cell of the SRAM, only small amounts of cache memory can be formed on the semiconductor chip which significantly limits the performance of the SRAM. With respect to the off-chip dense memories such as stand-alone DRAM or non-volatile memory, this memory improves in memory size but has reduced operating speeds and limited bandwidth, as the input/output (I/O) between the off-chip memory and the central processing unit (CPU) is limited. Therefore, the advantage of increased memory size does not enable performance gains—and thus limits the off-chip dense memory.

With respect to the conventional eDRAM, this DRAM forms memory bitcells next to logic transistors using the same process which is challenging to scale. Furthermore, the conventional DRAM is not capable of forming a significantly large capacitor without affecting the logic technology as such the use of DRAM applications requiring large capacitor-based memories has been dramatically limited.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
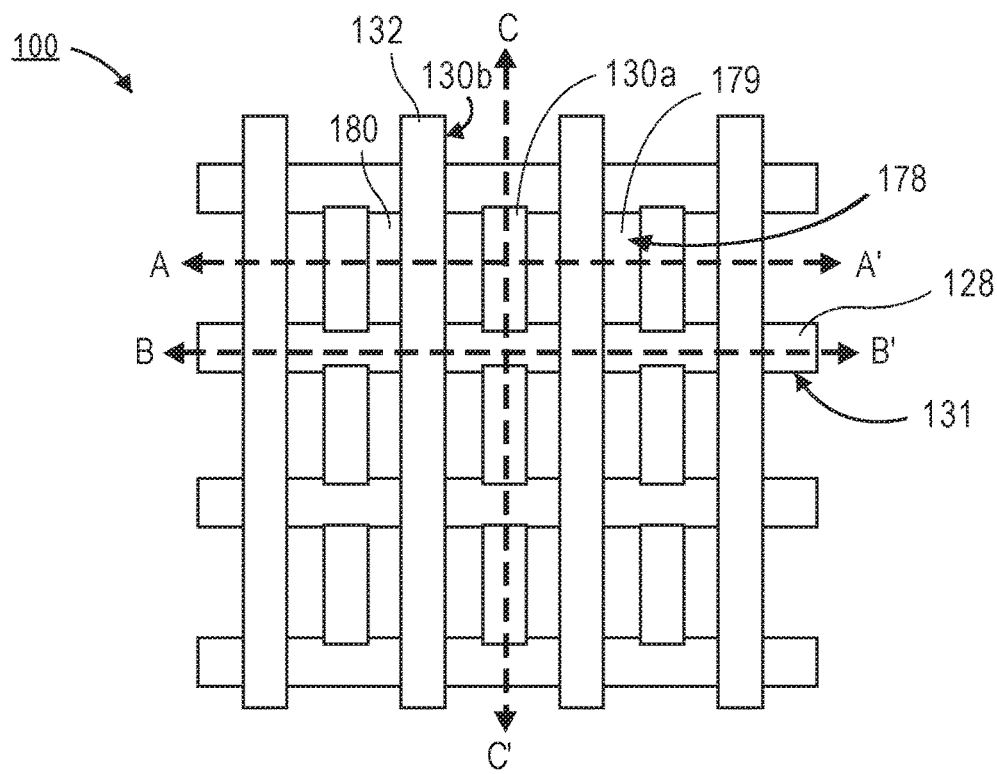
FIG. 1A is a block diagram illustrating a top view of a memory array including ferroelectric capacitors, dielectric layers, and metal layers underneath the memory array, according to one embodiment.

Embodiments described herein include an ultra-dense embedded static random-access memory (SRAM) device implementing a ferroelectric-capacitor integration using a multi-metal-level (MML) interconnect structure. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as integrated circuit design layouts such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As used herein, the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Likewise, certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating (or forming) an ultra-dense embedded SRAM device which integrates a ferroelectric-capacitor with a MML interconnect structure. Theses SRAM structures/arrangements described herein may be implemented in one or more components associated with an integrated circuit (IC) and/or between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in, for example, a computer.

Additionally, the embodiments described herein may be implemented further in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including an electronic device employing complementary metal-oxide-semiconductor (CMOS) technology having embedded SRAM devices integrated with ferroelectric-capacitors that are formed by a MML interconnect structure (e.g., as shown below in FIGS. 1A-1D).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As described above, one of the main problems with capacitor-based memory cells is providing a large enough capacitor surface area for each cell while keeping the memory cell size small and not substantially changing the baseline process of the interconnects.

Accordingly, embodiments described herein include an ultra-dense, embedded SRAM device. In particular, the embodiments described herein include a one-transistor, one-ferroelectric capacitor (1T-1FEC) embedded SRAM device integrating the ferroelectric-capacitor with MML interconnect structures—hereinafter referred to as "an embedded SRAM device" and/or "1T-1FEC SRAM device." Accordingly, embodiments described herein enable high density, embedded SRAM devices for scaled technology generations by increasing on-chip cache memory size approximately 2-3× or greater (or 2-3×). For example, in some embodiments, an increase of 2-3× in cache memory may improve the performance of ICs and/or electronic devices by approximately 30% to 50% (or, in other embodiments, approximately greater than 50%). As such, the embodiments described herein improve embedded SRAM devices/structures (e.g., including embedded ferroelectric capacitor-based memory and/or embedded dynamic random access memory (DRAM)) by implementing (i) a detailed layout of MML interconnects fabricated using standard processing which preserves the density and topography in the memory area; and (ii) the MML interconnects to form the backbone design of the large ferroelectric capacitors approximately 2-3 metal interconnect layers deep.

FIG. 1A is a block diagram illustrating a top view of a memory array 100 including control circuitry (or the like) underneath the memory array 100, according to one embodiment. In addition, FIG. 1A illustrates the memory array 100 having a cross-section at the A-A' axis which is illustrated below with FIG. 1B, a cross-section at the B-B' axis which is illustrated below with FIG. 1C, and a cross-section at the C-C' axis which is illustrated below with FIG. 1D.

In some embodiments, the memory array 100 may be or include a memory device, while in other embodiments the memory array may be or include a part of a memory device (e.g., an embedded, high density SRAM) or some other type of IC. The memory array 100 may be fabricated using a specified layout of interconnects (e.g., including one or more conductive/metal layer interconnects 130-132), where such interconnects may form a three-dimensional (3D) circuitry (or control circuitry) so that one or more memory cells (e.g., embedded SRAM devices/cells) may be disposed on/above a substrate.

For some embodiments, the memory array 100 may be formed and patterned as a multi-metal-level (MML) interconnect structure. As used herein, a "MML interconnect structure" refers to a specified layout of interconnects such as metal layers/lines used to form, but is not limited to, a memory array, a memory device (e.g., an embedded, high density SRAM), a portion of a memory device, and/or any other similar IC. Additionally, the "MML interconnect structure" refers to such layout of interconnects (i) formed by a one-directional patterning of interconnect metal layers in a state-of-the-art scaled technology, which helps to preserve the density and topography of the memory area; and (ii) used to then form a backbone shape of a capacitor (e.g., the ferroelectric capacitor 180 shown in FIG. 1B) with a thickness/depth of approximately 2-3 metal interconnect layers/levels. For example, the "MML interconnect structure" refers to a patterned layout of interconnects that are used to form a plurality of ferroelectric capacitors 180 degrees from the silicon plane or in the vertical z-axis of the 3D circuitry of the memory array 100 (or the embedded SRAM device).

In some embodiments, the memory array 100 initially includes forming the MML interconnect structure described herein by (i) stacking the one or more metal layers M1-M3 130-132 and the one or more ILD layers 160-162 in a repeating stitched pattern (or the like) to then form a plurality of trenches 179 having a plurality of trench openings 178; and (ii) then subsequently disposing one or more ferroelectric materials in each of the trenches 179 and openings 178 to form a plurality of ferroelectric capacitors 180. Accordingly, these MML interconnect structures enable forming multi-level capacitors over bitlines (COBs) using an embedded technique, while also improving high density embedded-SRAM devices for scaled technology generations by increasing the on-chip cache memory size of such devices by approximately 2-3×.

Furthermore, the "MML interconnect structure" refers to the patterned layout of interconnects having (i) a bottommost metal layer (e.g., the first metal (M1) layer 130a-b) that provides a landing pad for a bottom surface of a trench used to form the capacitor, and (ii) one or more subsequent metal layers (e.g., the second and third metal (M2-M3) layers 131-132) having alternating orthogonal cuts across the gates/perpendicular cuts along the gates (OGD/PGD) orientations as the subsequent metal layers repeat line/space patterns similar to the one-directional patterning of interconnect technologies described above. Note that, in one embodiment, the MML interconnect structure may implement a side-to-side space by using a plug process.

Referring back to FIG. 1A, the memory array 100 includes one or more metal layers 130-132 patterned and stacked on top of each other to form one or more MML interconnects. Additionally, for some embodiments, the memory array 100 may have additional metal layers stacked above the one or more metal layers 130-132 as long as, for example, the repeating pattern of pitches are approximately similar. In another embodiment, the memory array 100 may also include less than three metal layers if desired.

In some embodiments, the memory array 100 may implement a substrate as a mechanical base for the memory array 100, where for example the bottommost metal layer 130 may be used to couple the circuitry of the memory array 100 to the substrate. Conversely, in other embodiments, the memory array 100 may implement the substrate as the mechanical base for the memory array 100—without using the substrate itself for the circuitry of the memory array 100.

Furthermore, as illustrated in FIG. 1A, the memory array 100 has a plurality long vertical interconnects comprising of the M1 layers 130b and the M3 layers 132, and a plurality of shorter vertical interconnects comprising of the M1 layers 130a formed in between the plurality of long vertical interconnects. Note that the M1-M3 layers/interconnects may also be referred to as the M1-M3 traces/lines. In one embodiment, the first metal (M1) layer includes a plurality of M1 layers 130a (or portions 130a of the M1 layer) formed as landing pads for the bottom surfaces of the capacitors, and a plurality of M1 layers 130b (or portions 130b of the M1 layer) formed as floating lines (or floating pads) that are adjacent to the plurality of M1 layers 130b and also disposed below the M3 layers 132. Meanwhile, as illustrated in FIG. 1A, the memory array 100 has a plurality long horizontal interconnects comprising of a plurality of hardmask layers 128 and a plurality of M2 layers 131. The hardmask layer 128 may be formed on the topmost surface of the memory array 100. In some embodiments, the hardmask layer 128 may be disposed above each of the M1-M3 layers 130-132 (e.g., as shown with B-B' axis of FIGS. 1A and 1C), and in other embodiments may be disposed only above the M2 layer 131 (e.g., as shown with C-C' axis of FIGS. 1A-1D).

According to some embodiments, the memory array 100 may be or include an embedded SRAM device and/or a part of an embedded SRAM device. The embedded SRAM device 100 may include the one or more metal layers 130-132, one or more interlayer dielectric (ILD) layers (e.g., the ILD layers 160-162 of FIGS. 1B-1D), and one or more ferroelectric capacitors 180 formed thereof. Moreover, the embedded SRAM device 100 may further include various additional circuitry in addition to the memory array. For example, the circuitry may include one or more IC components, such as address decoders, line drivers, sense amplifiers, charge-pumps, state machines, and/or various other types of circuitry.

Note that the memory array 100 (and/or the embedded SRAM device) as shown in FIG. 1A may include fewer or additional packaging components and/or materials based on the desired packaging design.

Figure 1B:
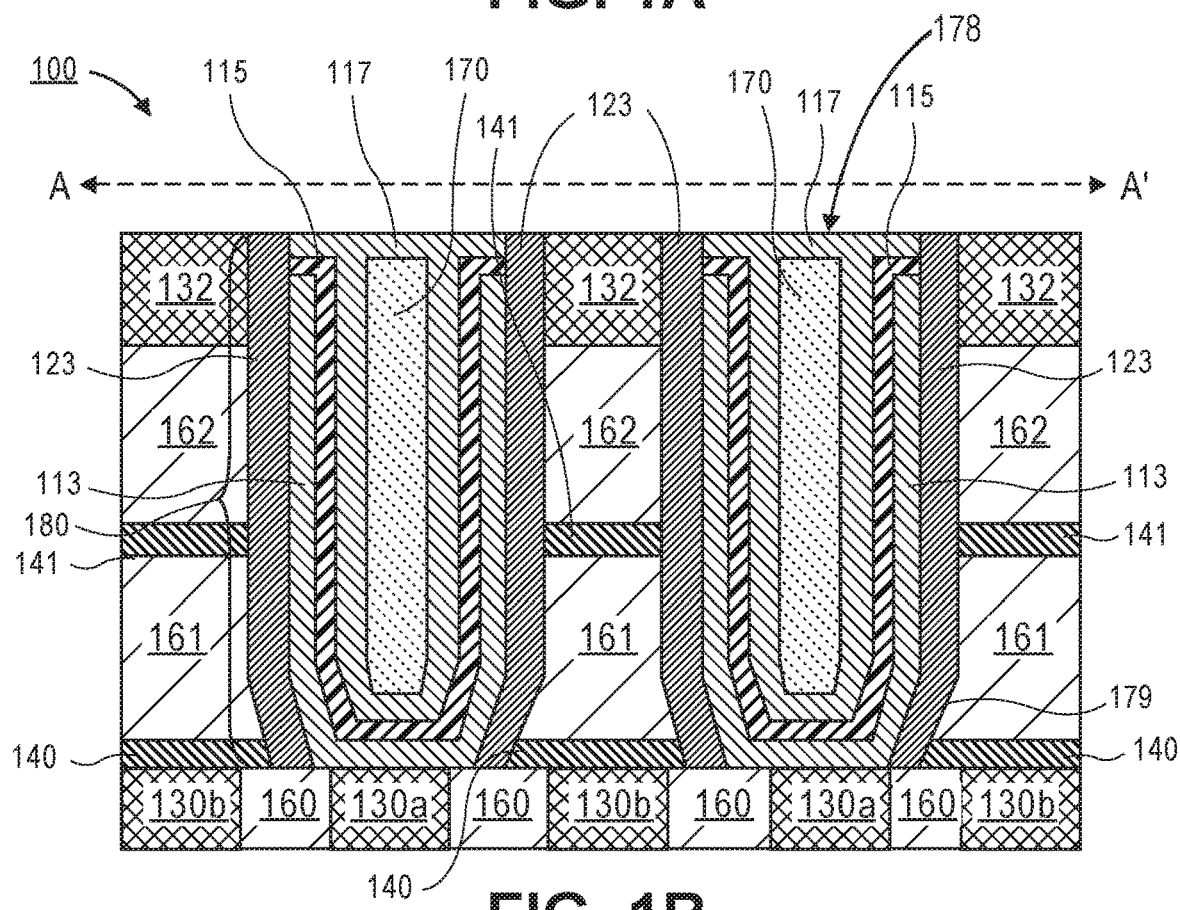
FIGS. 1B and 1D are illustrations of cross-sectional views of the memory array at an A-A' axis and a C-C' axis, respectively, which includes ferroelectric capacitors, dielectric layers, and metal layers, according to some embodiment.

FIG. 1B is an illustration of a cross-sectional view of the memory array 100 at an A-A' axis that includes ferroelectric capacitors 180 formed in the ILD layers 160-162 and the metal layers 130 and 132, according to some embodiment.

For some embodiments, a plurality of ferroelectric capacitors 180 are formed in the z-axis of the 3D circuitry of the memory array 100 (or the embedded SRAM device). In some embodiments, the memory array 100 initially includes forming the MML interconnect structure by stacking the one or more metal layers M1-M3 130-132 and the one or more ILD layers 160-162 in a repeating stitched pattern or the like (as shown with the top view of FIG. 1A), where the stacked MML interconnect structure then forms a plurality of trenches 179 and a plurality of trench openings 178. In some embodiments, the trenches 179 have a thickness (or a depth) approximately defined from a top surface of the M1 layer 130a to a top surface of the M3 layer 132.

In some embodiments, the M1-M3 layers 130-132 may be formed using any conventional lithographic patterning and plating process or the like. In one embodiment, after the M3 layer 132 is disposed, an opposite direction lithographic patterning is implemented to dispose a COB hardmask layer 128 (as shown in the B-B' axis) above the M3 layer 132. Using both this pattern and the orthogonal M3 layer pattern, an isotropic reactive-ion etching (ME) etch process may be implemented on these two self-aligned patterns to create the plurality of trenches 179 (or the plurality of square trenches) for the ferroelectric capacitors 180 (e.g., as illustrated with the square trenches 179 of FIG. 1A). Note that the selective ME etch preserves the M3 metal layer 132 to form self-aligned COBs. For example, the selective ME etching process may initially pattern and form the trench opening 178 through the M3 layer 132, and may then proceed with patterning the trench opening 178 through the ILD layer 162, the etch layer 141 (or the etch stop layer), the ILD layer 162, and the etch layer 140, respectively, to form the trench 179. In one embodiment, the etch layers 140-141 are disposed on the M1-M2 layers 130-131, respectively. In addition to these patterning steps, a spacer process may be implemented to dispose a plurality of insulating sidewall layers (also referred to sidewall spacers) into the trench 179 to prevent shorting a bottom capacitor plate (i.e., the bottom electrode layer 180) to the side metal surfaces of the M3 layer 132. Note that the etching process described herein to form the trenches 179 may be performed by any of the known etching techniques such as dry etching, wet etching, or any combination thereof.

For some embodiments, after the formation of the trenches 179 and the insulating sidewall layers 123, the memory array 100 then subsequently includes disposing (or depositing) a plurality of bottom electrode layers 113 (also referred to as first electrode layers), a plurality of ferroelectric layers 115 (or a plurality of layers comprising of one or more ferroelectric materials), and a plurality of top electrode layers 117 (also referred to as second electrode layers) into the plurality of trenches 179 to form a plurality of ferroelectric capacitors 180. In addition, the memory array 100 may include disposing a plurality of insulating layers 170 (or a capacitor insulator) into the plurality of trenches 179 as the insulating layers 170 are disposed above the top electrode layers 117. Lastly, in some embodiments, the memory array 100 may include redisposing (or redepositing) additional top electrode layers 117 above the ferroelectric layers 115, the top electrode layers 117, and then the insulating layers 170 to top off the top surfaces of the ferroelectric capacitors 180, where a polishing process may be implemented to polish/flatten the top surface of the top electrode layers 117 for each of the ferroelectric capacitors 180. As such, in these embodiments, the insulating layers 170 may be embedded (or surrounded) by the top electrode 117, where the insulating layers 170 may include air, a dielectric, or the like.

As illustrated in FIG. 1B, the ferroelectric capacitor 180 has the bottom electrode 113 disposed on the M1 layer 130a to act as a bottommost metal layer and a landing pad for the bottom surface of the trench 179. The ferroelectric capacitor 180 further includes the ferroelectric layer 115 disposed between the top electrode layer 117 and the bottom electrode layer 113, where the ferroelectric layer 115 includes one or more ferroelectric materials. The ferroelectric layer 115 may include one or more materials that exhibit sufficient ferroelectric behavior properties, even at thin/small dimensions as typically used in such scaled cells as the ones described herein. For example, the one or more ferroelectric materials may include, but are not limited to, hafnium zirconium oxide (HfZrO, also referred to as HZO), silicon-doped (Si-doped) hafnium oxide, germanium-doped (Ge-doped) hafnium oxide, aluminum-doped (Al-doped) hafnium oxide, and/or yttrium-doped (Y-doped) hafnium oxide. In some embodiments, the ferroelectric layer 115 may have a thickness between approximately 5 nm to 10 nm.

Additionally, the ferroelectric capacitor 180 includes the bottom electrode layer 113 (also referred to as a first electrode layer) disposed between the insulating sidewall 123 and the ferroelectric layer 115. Likewise, the ferroelectric capacitor 180 includes the top electrode layer 117 (also referred to as a second electrode layer) disposed between the ferroelectric layer 115 and the insulating layer 170. In some embodiments, each of the bottom and top electrodes 113 and 115 may include one or more conductive materials (or metals), including ruthenium, tungsten, copper, aluminum, tantalum nitride, titanium nitride, and/or any stack or other combination of these metals. In other embodiments, the bottom and top electrodes 113 and 115 may also include different materials from each other to help with the different requirements of the bottom and top capacitor plates. Specific annealing and deposition temperatures of these metals and their crystalline quality may be selected to improve quality of ferroelectric capacitors. According to some embodiments, the bottom and top electrodes 113 and 115 may have a similar thickness between approximately 2 nm to 10 nm, or in other embodiments may have different thickness, where each of the bottom and top electrodes 113 and 115 may have a thickness between approximately 3 nm to 9 nm.

In various embodiments, each of the M1-M3 layers 130-132 may include one or more electrically conductive materials such as any suitable electrically conductive material, alloy, or a stack of multiple electrically conductive materials. In some embodiments, various electrically conductive materials described herein may also include one or more metals or metal alloys, with metals such as, for example, ruthenium, palladium, platinum, cobalt, nickel, hafnium, zirconium, titanium, tantalum, and/or aluminum. In some embodiments, various electrically conductive materials described herein may include one or more electrically conductive alloys oxides or carbides of one or more metals. For some embodiments, the M1-M3 layers 130-132 may be formed using any suitable known deposition and patterning techniques, such as, for example, atomic layer deposition (ALD), chemical vapor deposition (CVD), physical vapor deposition (PVD), and any other various lithographic techniques (e.g., photolithography or electron-beam lithography).

For some embodiments, the ILD layers 160-162 and the insulating layer 170 may include one or more dielectric materials having a high-k dielectric, such as elements include hafnium, silicon, oxygen, titanium, tantalum, lanthanum, aluminum, zirconium, barium, strontium, yttrium, lead, scandium, niobium, and/or zinc. As used herein, a "high-k dielectric" refers to a material having a higher dielectric constant (k) than silicon oxide, where the terms "oxide," "carbide," "nitride," etc. refer to compounds containing, respectively, oxygen, carbon, nitrogen, etc. Examples of high-k materials that may be used in the ILD layers 160-162 and the insulating layer 170 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate. In some embodiments, the insulating layer 170 may have a thickness between approximately 0.5 nm to 30 nm.

In some embodiments, the insulating sidewall 123 may include an oxide, e.g., silicon oxide, or in others embodiments the insulating sidewall 123 may include a nitride, e.g., silicon nitride. In other embodiments, the insulating sidewall 123 may include any insulating material, e.g., one or more polymer materials. In one embodiment, the insulating sidewall 123 may be disposed/deposited onto the ILD layers 161-162 as a spacer using a blanket deposition technique, e.g., CVD, sputtering, or any other know thin film deposition technique. In some embodiments, the etch layers 140-141 may include an etch resistant material, such as, but not limited to TiO, ZrO, AlN, ZrAlTiO, AlO, and/or the like.

Note that, as described above, the M1 layer 130 (or the bottommost metal layer) may be disposed/formed or carried out on a substrate, such as a package substrate, a printed circuit board (PCB), and/or a motherboard. In one embodiment, the substrate may be a crystalline substrate formed using a bulk silicon or a silicon-oninsulator substructure. In other embodiments, the substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, and/or other combinations of group III-V, group II-VI, or group IV materials. Although a few examples of materials from which the substrate may be formed are described here, any material that may serve as a foundation (or a foundation layer) upon which a semiconductor device may be built may be included (or considered) a substrate.

Note that the memory array 100 as shown in FIG. 1B may include fewer or additional packaging components and/or materials based on the desired packaging design.

Figure 1C:
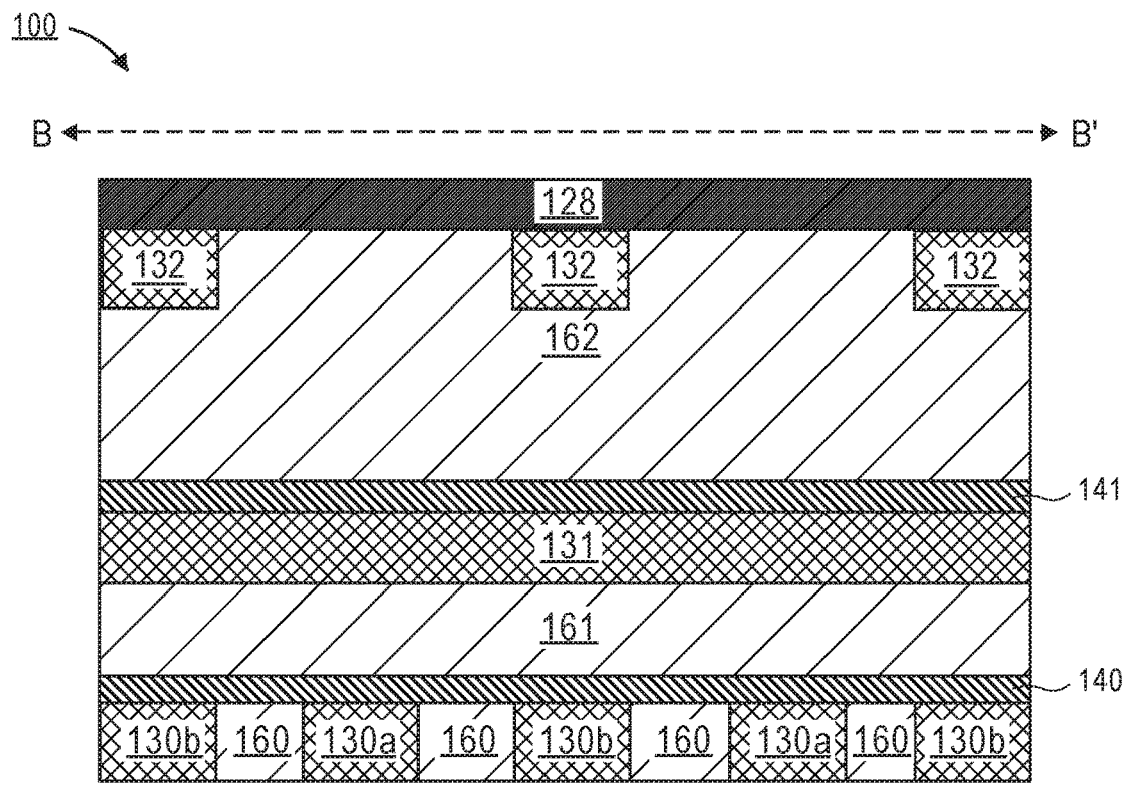
FIG. 1C is an illustration of a cross-sectional view of the memory array at a B-B' axis, which includes a hardmask layer, dielectric layers, and metal layers, according to one embodiment.
Figure 1D:
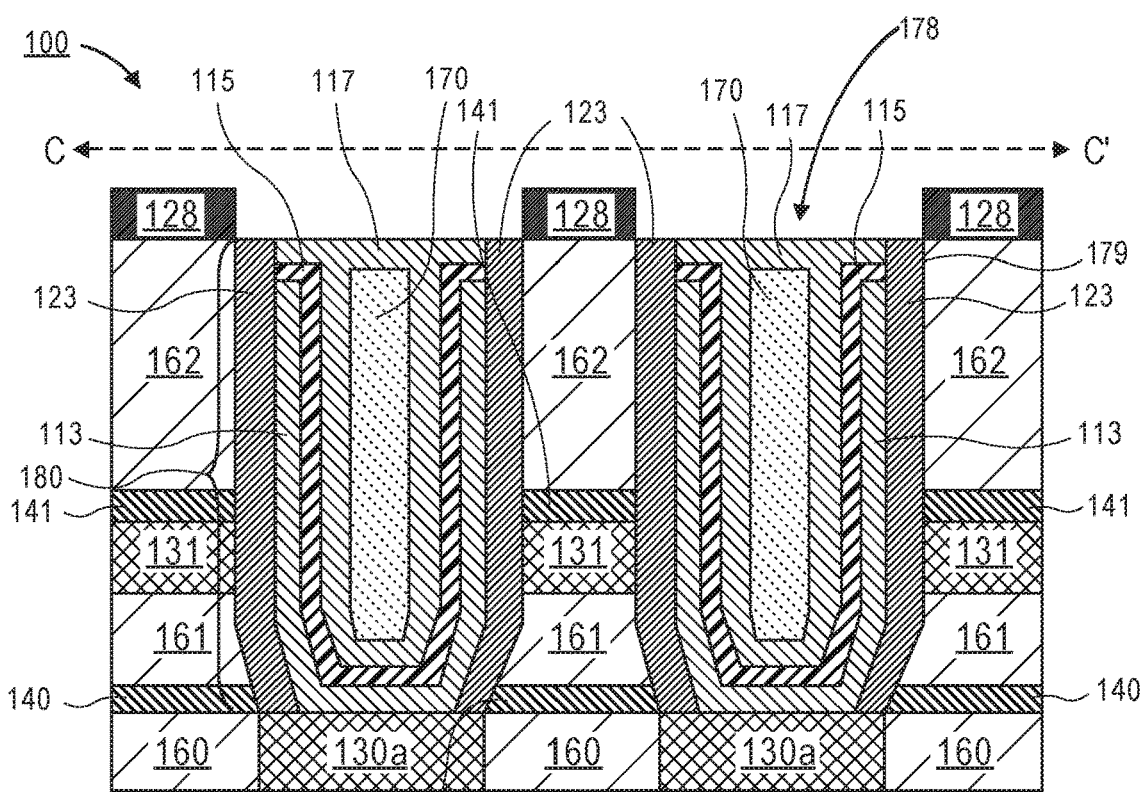

FIG. 1C is an illustration of a cross-sectional view of the memory array 100 at a B-B' axis which includes a hardmask layer 128, the ILD layers 160-162, and the M1-M3 layers 130-132, according to one embodiment. In one embodiment, the memory array 100 includes the hardmask layer 128 disposed over the top surface of the ILD layer 162. As shown in FIG. 1D, the hardmask layer 128 is disposed over the ILD layer 162, while the trench openings 178 are exposed and not covered with the hardmask layer 128. In one embodiment, the hardmask layer 128 may be a dielectric material, such as a nitride or an oxide. The hardmask layer 128 may be formed in the same horizontal axis as the M2 layer 131 in which there is no etching implemented in these respective regions. Accordingly, for some embodiment, the hardmask layer 128 may be resistant to an etching process that may be used to etch through one or more of the metal layers 130-132, the ILD layers 161-162, and the etch layers 140-141. In some embodiments, the hardmask layer 128 may have a thickness between approximately 2 nm to 10 nm.

Note that the memory array 100 as shown in FIG. 1C may include fewer or additional packaging components and/or materials based on the desired packaging design.

FIG. 1D is an illustration of a cross-sectional view of the memory array 100 at a C-C' axis which includes ferroelectric capacitors 180 formed in the ILD layers 160-162 and the metal layers 130 and 132, according to some embodiment. In particular, FIG. 1D illustrates the C-C' axis cross-sectional view which is parallel to the M3 layers 132, as such the M3 layers 132 are not visible in this respective the view. In one embodiment, the memory array 100 includes the hardmask layer 128 disposed over the ILD layer 162, where the hardmask layer 128 is patterned to include the plurality of trench openings 178 that expose the top surfaces of the top electrode layers 117.

As such, in some embodiments as described above in FIGS. 1A-1D, the memory array 100 may thus include: a first dielectric layer 161 disposed over first metal traces 130a-b, where the first metal traces 130a-b extend along a first direction; second metal traces 131 disposed on the first dielectric layer 161, where the second metal traces 161 extend along a second direction that is perpendicular to the first direction; third metal traces 132 disposed on the second dielectric layer 162, where the third metal traces 132 extend along the first direction; a ferroelectric capacitor 180 positioned in a trench 179, the trench 179 includes one or more sidewalls and a bottom surface above a first metal trace 130a (i.e., a landing pad of the first metal trace), where the trench 179 has a depth defined from a top surface of the first metal trace 130a to the top surface of the third metal trace 132; and an insulating sidewall layer 123, a first electrode layer 113, a ferroelectric layer 115, and a second electrode layer 117 disposed in the trench 179 of the ferroelectric capacitor 180, where the trench 179 of the ferroelectric capacitor 180 has a rectangular cylinder shape that is defined by the first, second, and third metal traces 130-132, and where the bottom surface of the trench 179 of the ferroelectric capacitor 180 includes the insulating sidewall layer 123 and the first electrode layer 113.

Continuing with the above embodiments, the memory array 100 may further include that the first metal traces include pads 130a and lines 130b, where the second and third metal traces 131-132 are adjacent to the one or more sidewalls of the trench 179 of the ferroelectric capacitor 180, and where the third metal traces 132 extend along the first direction that is perpendicular to the second direction of the second metal traces 131. The memory array 100 also includes: a third dielectric layer 160 disposed in between the pads 130a and the lines 130b of the first metal traces; an insulating layer 170 disposed in the trench 179 of the ferroelectric capacitor 180 and surrounded by the second electrode layer 117; a first etch stop layer 140 disposed on the third dielectric layer 160 and the first metal traces 139*a-b*; a second etch stop layer 141 disposed on the second metal traces 131; and a trench opening 178 exposing a top surface of the second electrode layer 117 of the ferroelectric capacitor 180.

According to some embodiments, one or more types of memory cells may utilize such techniques described herein, including, but are not limited to, an embedded SRAM, an embedded capacitor-based memory needing large ferroelectric capacitors, an embedded DRAM, a floating gate flash memory, a charge-trap flash memory, a phase-change memory, a phase change memory with a switch, a resistive memory, and/or an ovonic memory. Additionally, one or more memory technologies are capable of being implemented with the MML interconnect structure integrated with the ferroelectric capacitors described herein, including emerging technologies such as high density embedded SRAM for scaled technology generations, ferroelectric transistor random access memory (FeTRAM), nanowire technology, and/or any other future technologies.

Note that the memory array 100 as shown in FIG. 1D may include fewer or additional packaging components and/or materials based on the desired packaging design.

Figure 2B:
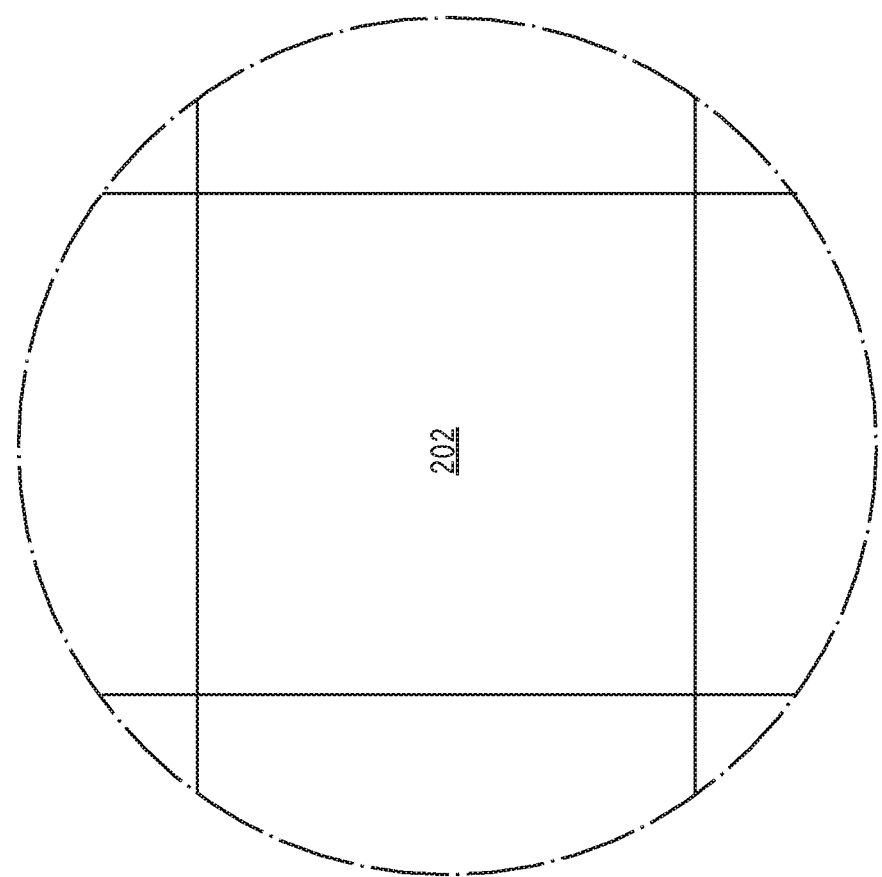
FIGS. 2A and 2B are illustrations of top views of an electronic device having a wafer and dies with one or more embedded non-volatile memory structures that include ferroelectric-capacitors and multi-metal-level (MML) interconnects, according to some embodiments.
Figure 2A:
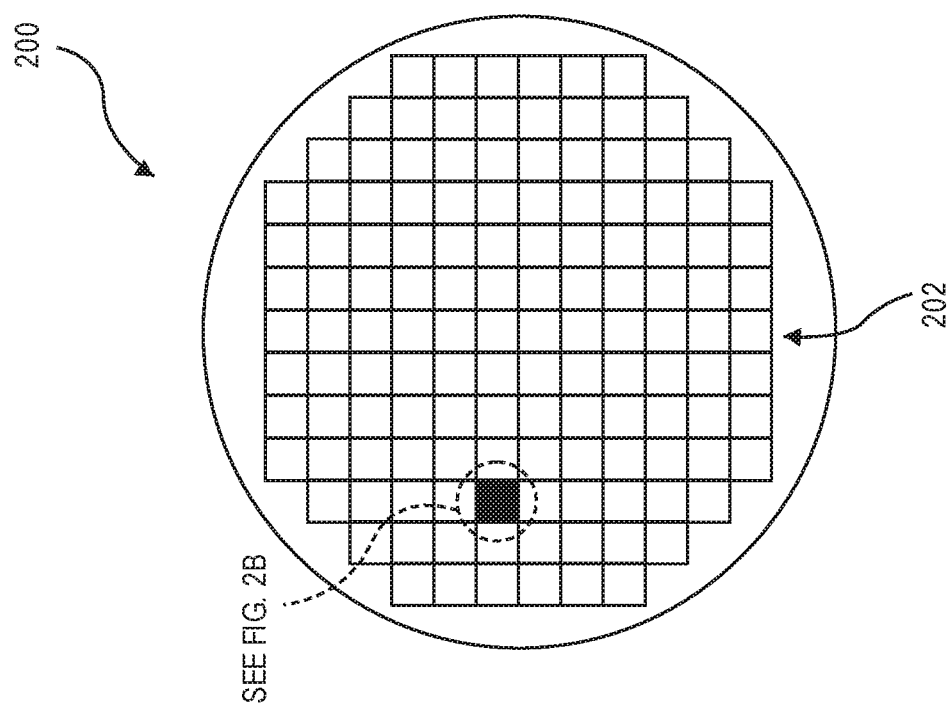

Referring now to FIGS. 2A-2B. The integrated circuit structures described herein may be included in an electronic device. As an example of one such apparatus, FIGS. 2A and 2B are top views of a wafer and dies that include one or more embedded non-volatile memory structures having ferroelectric-capacitors and MML interconnects, in accordance with one or more of the embodiments described herein.

As illustrated in FIGS. 2A-2B, a wafer 200 may be composed of semiconductor material and may include one or more dies 202 having integrated circuit (IC) structures formed on a surface of the wafer 200. Each of the dies 202 may be a repeating unit of a semiconductor product that includes any suitable IC (e.g., ICs including one or more embedded non-volatile memory structures having ferroelectric-capacitors and MML interconnects as described above). After the fabrication of the semiconductor product is complete, the wafer 200 may undergo a singulation process in which each of the dies 202 is separated from one another to provide discrete "chips" of the semiconductor product. In particular, structures that include embedded non-volatile memory structures having an independently scaled selector as described herein may take the form of the wafer 200 (e.g., not singulated) or the form of the die 202 (e.g., singulated). The die 202 may include one or more embedded non-volatile memory structures based independently scaled selectors and/or supporting circuitry to route electrical signals, as well as any other IC components. In some embodiments, the wafer 200 or the die 202 may include an additional memory device (e.g., SRAM device), a logic device (e.g., an AND, OR, NAND, or NOR gate), or any other suitable circuit element. Multiple ones of these devices may be combined on a single die 202. For example, a memory array formed by multiple memory devices may be formed on a same die 202 as a processing device or other logic that is configured to store information in the memory devices or execute instructions stored in the memory array.

Embodiments described herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches described herein.

Note that the wafer 200 and/or the die 202 may include fewer or additional components and/or materials based on the desired packaging design.

Figure 3:
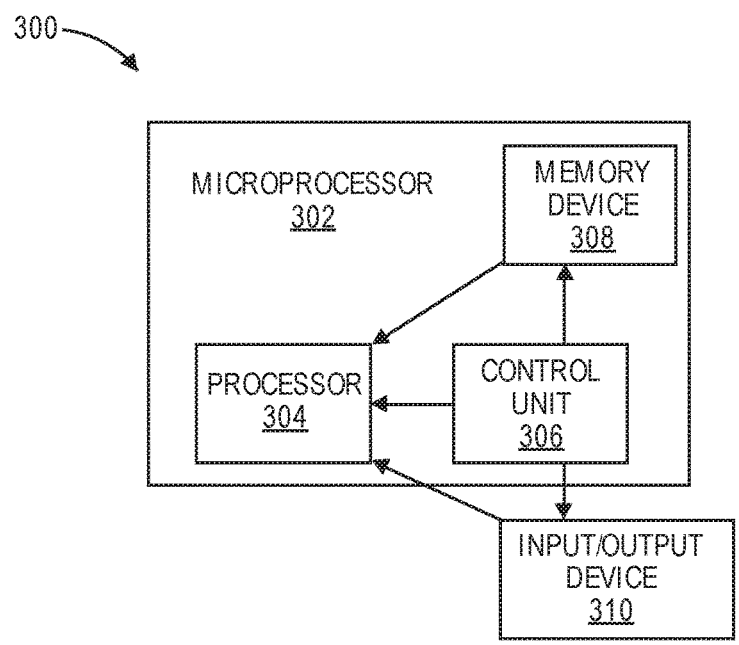
FIG. 3 is a schematic block diagram illustrating an electronic system that utilizes an input/output (I/O) device and a semiconductor package, which includes a processor, a memory device, and a control unit, according to one embodiment.

FIG. 3 is a schematic block diagram illustrating an electronic system 300 that utilizes an input/output (I/O) device 310 and a microprocessor 302, which includes a processor 304, a memory device 308, and a control unit 306, according to one embodiment. FIG. 3 is an illustration of an electronic system 300, according to one embodiment. The electronic system 300 can correspond to, for example, a portable system, a computer system, a process control system, or any other system that utilizes a processor and an associated memory. The electronic system 300 may include the microprocessor 302, the processor 304, the control unit 306, the memory device 308, and the I/O device 310. Note that it is to be appreciated that the electronic system 300 may have a plurality of processors, control units, memory device units, and/or I/O devices in various embodiments. In one embodiment, the electronic system 300 has a set of instructions that define operations which are to be performed on data by the processor 304, as well as, other transactions between the processor 304, the memory device 308, and the I/O device 310. The control unit 306 coordinates the operations of the processor 304, the memory device 308 and the I/O device 310 by cycling through a set of operations that cause instructions to be retrieved from the memory device 308 and executed. The memory device 308 can include a non-volatile memory cell as described above (e.g., the embedded SRAM device 100 of FIGS. 1A-1D). In an embodiment, the memory device 308 is embedded in the microprocessor 302, as illustrated in FIG. 3. In another embodiment, the processor 304, or another component of the electronic system 300, may include one or more embedded non-volatile memory structures having ferroelectric-capacitors and MML interconnects, such as those described herein Note that the electronic system 300 may include fewer or additional packaging components and/or materials based on the desired packaging design.

Figure 4:
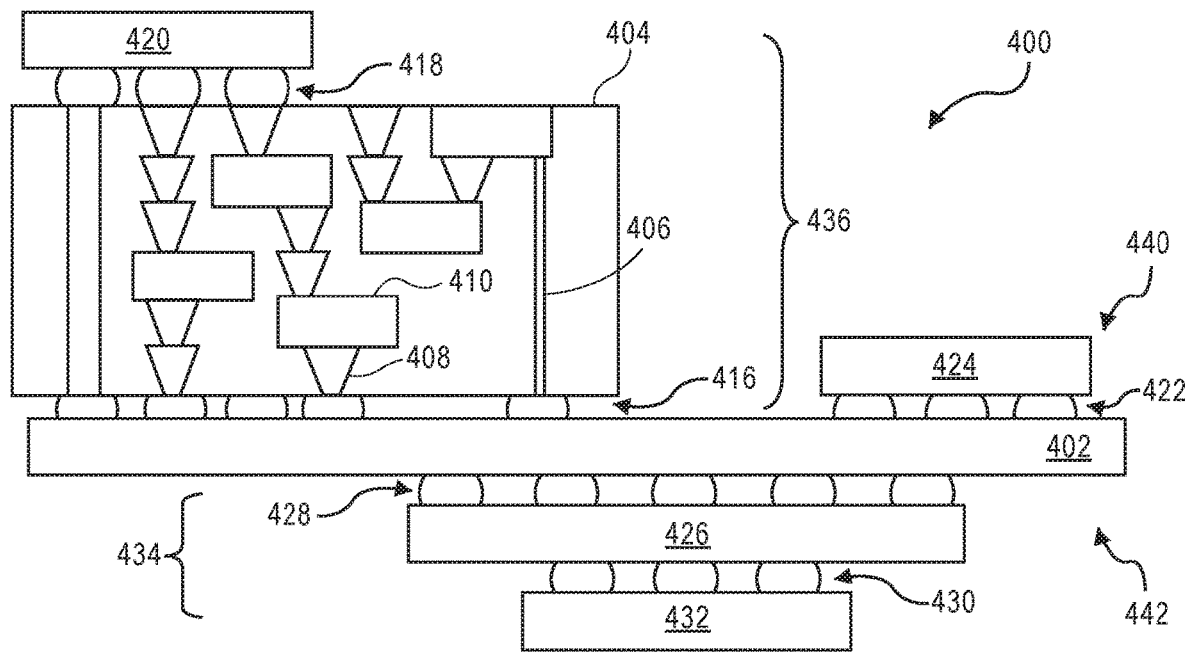
FIG. 4 is a cross-sectional view of an integrated circuit (IC) device assembly that includes one or more embedded non-volatile memory structures having ferroelectric-capacitors and MML interconnects, according to one embodiment.

FIG. 4 is a cross-sectional side view of an IC device assembly which may include one or more embedded non-volatile memory structures having ferroelectric-capacitors and MML interconnects, in accordance with one or more of the embodiments described herein. As illustrated in FIG. 4, an IC device assembly 400 includes components having one or more IC structures as described herein. The IC device assembly 400 includes a number of components disposed on a circuit board 402 (e.g., a motherboard). The IC device assembly 400 includes components disposed on a first face 440 of the circuit board 402 and an opposing second face 442 of the circuit board 402. Generally, components may be disposed on one or both faces 440 and 442. In particular, any suitable ones of the components of the IC device assembly 400 may include a number of embedded non-volatile memory structures having ferroelectric-capacitors and MML interconnects, such as the embedded SRAM devices described above/herein.

In some embodiments, the circuit board 402 may be a printed circuit board (PCB) including multiple metal layers separated from one another by layers of dielectric material (e.g., such as the MML interconnect layers described above) and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a non-PCB substrate.

The IC device assembly 400 illustrated in FIG. 4 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 4), male and female portions of a socket, an adhesive, an underfill material, and/or any other suitable electrical and/or mechanical coupling structure.

The package-on-interposer structure 436 may include an IC package 420 coupled to an interposer 404 by coupling components 418. The coupling components 418 may take any suitable form for the application, such as the forms discussed above with reference to the coupling components 416. Although a single IC package 420 is shown in FIG. 4, multiple IC packages may be coupled to the interposer 404. Note that it is to be appreciated that additional interposers may be coupled to the interposer 404. The interposer 404 may provide an intervening substrate used to bridge the circuit board 402 and the IC package 420. The IC package 420 may be or include, for example, a die (e.g., the die 202 of FIG. 2B), or any other suitable component. Generally, the interposer 404 may spread a connection to a wider pitch or reroute a connection to a different connection. For example, the interposer 404 may couple the IC package 420 (e.g., a die) to a ball grid array (BGA) of the coupling components 416 for coupling to the circuit board 402. In the embodiments illustrated in FIG. 4, the IC package 420 and the circuit board 402 are attached to opposing sides of the interposer 404. In other embodiments, the IC package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some implementations, the interposer 404 may be formed of alternate rigid or flexible materials that may include the same materials described above for use in a semiconductor substrate, such as silicon, germanium, and other group III-V and group IV materials. The interposer 404 may include metal interconnects 410 and vias 408, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The IC device assembly 400 may include an IC package 424 coupled to the first face 440 of the circuit board 402 by coupling components 422. The coupling components 422 may take the form of any of the embodiments discussed above with reference to the coupling components 416, and the IC package 424 may take the form of any of the embodiments described above with reference to the IC package 420.

The IC device assembly 400 illustrated in FIG. 4 includes a package-on-package structure 434 coupled to the second face 442 of the circuit board 402 by coupling components 428. The package-on-package structure 434 may include an IC package 426 and an IC package 432 coupled together by coupling components 430 such that the IC package 426 is disposed between the circuit board 402 and the IC package 432. The coupling components 428 and 430 may take the form of any of the embodiments of the coupling components 416 discussed above, and the IC packages 426 and 432 may take the form of any of the embodiments of the IC package 420 described above. The package-on-package structure 434 may be configured in accordance with any of the package-on-package structures known in the art.

Note that the IC device assembly 400 may include fewer or additional packaging components and/or materials based on the desired packaging design.

Figure 5:
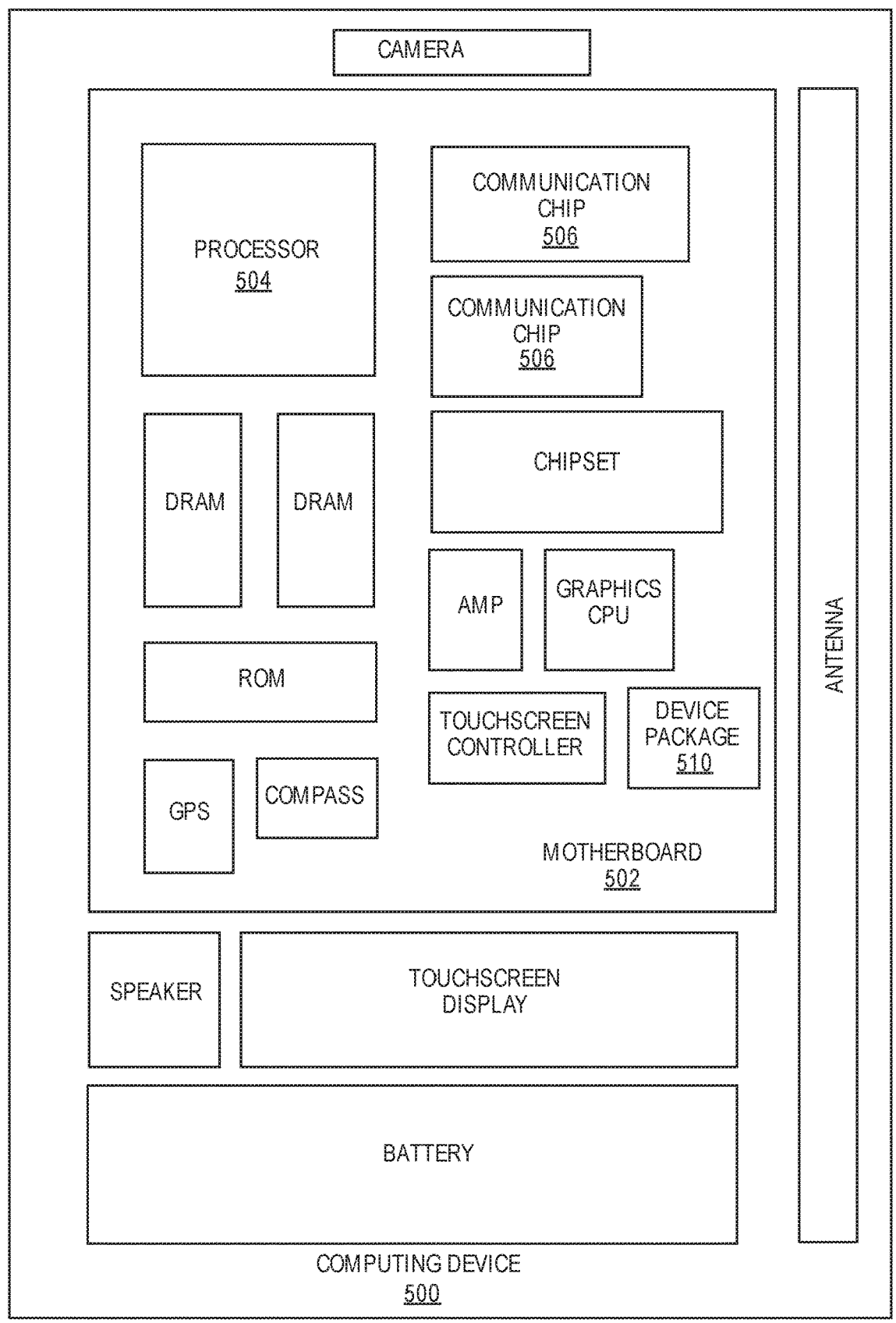
FIG. 5 is a schematic block diagram illustrating a computer system that utilizes a device package having one or more embedded non-volatile memory structures having ferroelectric-capacitors and MML interconnects, according to one embodiment.

FIG. 5 is a schematic block diagram illustrating a computer system that utilizes a device package having a memory array that includes ferroelectric capacitors formed in dielectric layers and metal layers, according to one embodiment. FIG. 5 illustrates an example of computing device 500. Computing device 500 houses motherboard 502. For one embodiment, motherboard 502 may be similar to the circuit board 402 of FIG. 4. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a packaging/package substrate, and/or a PCB. Device package 510 may include one or more embedded non-volatile memory structures with ferroelectric-capacitors using MML interconnect structures as described herein (e.g., as illustrated in FIGS. 1A-1D). Device package 510 may also include any other components from the Figures described herein.

Note that device package 510 may be a single component/device, a subset of components, and/or an entire system, as the materials, features, and components may be limited to device package 510 and/or any other component of the computing device 500 that may need high density SRAM having ferroelectric capacitors using the MML interconnect structures (e.g., the motherboard 502, the processor 504, and/or any other component of the computing device 500).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a memory array comprising of a first dielectric layer over first metal traces. The first metal traces extend along a first direction; second metal traces on the first dielectric layer. The second metal traces extend along a second direction that is perpendicular to the first direction; third metal traces on the second dielectric layer. The third metal traces extend along the first direction; a ferroelectric capacitor positioned in a trench, the trench includes one or more sidewalls and a bottom surface above a first metal trace. The trench has a depth defined from a top surface of the first metal trace to the top surface of the third metal trace; and an insulating sidewall layer, a first electrode layer, a ferroelectric layer, and a second electrode layer disposed in the trench of the ferroelectric capacitor. The trench of the ferroelectric capacitor has a rectangular cylinder shape that is defined by the first, second, and third metal traces.

In example 2, the subject matter of example 1 can optionally include the first metal traces which include pads and lines. The second and third metal traces are adjacent to the one or more sidewalls of the trench of the ferroelectric capacitor. The third metal traces extend along the first direction that is perpendicular to the second direction of the second metal traces.

In example 3, the subject matter of any of examples 1-2 can optionally include a third dielectric layer disposed in between the pads and the lines of the first metal traces.

In example 4, the subject matter of any of examples 1-3 can optionally include an insulating layer disposed in the trench of the ferroelectric capacitor and surrounded by the second electrode layer.

In example 5, the subject matter of any of examples 1-4 can optionally include the ferroelectric layer surrounded by the first electrode layer and the second electrode layer. The ferroelectric layer includes one or more ferroelectric materials, including hafnium zirconium oxide (HfZrO), silicon-doped (Si-doped) hafnium oxide, germanium-doped (Ge-doped) hafnium oxide, aluminum-doped (Al-doped) hafnium oxide, and yttrium-doped (Y-doped) hafnium oxide.

In example 6, the subject matter of any of examples 1-5 can optionally include a first etch stop layer on the third dielectric layer and the first metal traces; and a second etch stop layer on the second metal traces.

In example 7, the subject matter of any of examples 1-6 can optionally include the bottom surface of trench of the ferroelectric capacitor disposed on a top surface of a pad of the first metal traces. The bottom surface of the trench of the ferroelectric capacitor includes the insulating sidewall layer and the first electrode layer.

In example 8, the subject matter of any of examples 1-7 can optionally include a hardmask layer on a top surface of the second dielectric layer. The hardkmask layer has a trench opening that exposes a top surface of the second electrode layer of the ferroelectric capacitor.

In example 9, the subject matter of any of examples 1-8 can optionally include the first and second electrode layers which include one or more conductive materials, including ruthenium, tungsten, copper, aluminum, tantalum nitride, titanium nitride, and any combination thereof. The first electrode layer has one or more conductive materials that are similar or different to one or more conductive materials of the second electrode layer. The first electrode has a thickness that is approximately equal to or different than a thickness of the second electrode layer.

Example 10 is a method of forming a memory array, comprising of disposing a first dielectric layer over first metal traces. The first metal traces extend along a first direction; disposing second metal traces on the first dielectric layer. The second metal traces extend along a second direction that is perpendicular to the first direction; disposing third metal traces on the second dielectric layer. The third metal traces extend along the first direction; forming a trench through the third metal traces, the second dielectric layer, the second metal traces, and the first dielectric layer. The trench includes one or more sidewalls and a bottom surface above a first metal trace. The trench has a depth defined from a top surface of the first metal trace to the top surface of the third metal trace. The trench is self-aligned by the third metal traces and the second metal traces; and disposing an insulating sidewall layer, a first electrode layer, a ferroelectric layer, and a second electrode layer, respectively, into the trench to form a ferroelectric capacitor. The trench of the ferroelectric capacitor has a rectangular cylinder shape that is defined by the first, second, and third metal traces.

In example 11, the subject matter of example 10 can optionally include the first metal traces which include pads and lines. The second and third metal traces are adjacent to the one or more sidewalls of the trench of the ferroelectric capacitor. The third metal traces extend along the first direction that is perpendicular to the second direction of the second metal traces.

In example 12, the subject matter of any of examples 10-11 can optionally include disposing a third dielectric layer in between the pads and the lines of the first metal traces.

In example 13, the subject matter of any of examples 10-12 can optionally include disposing an insulating layer in the trench of the ferroelectric capacitor and surrounded by the second electrode layer.

In example 14, the subject matter of any of examples 10-13 can optionally include the ferroelectric layer surrounded by the first electrode layer and the second electrode layer. The ferroelectric layer includes one or more ferroelectric materials, including HfZrO, Si-doped hafnium oxide, Ge-doped hafnium oxide, Al-doped hafnium oxide, and Y-doped hafnium oxide.

In example 15, the subject matter of any of examples 10-14 can optionally include disposing a first etch stop layer on the third dielectric layer and the first metal traces; and disposing a second etch stop layer on the second metal traces.

In example 16, the subject matter of any of examples 10-15 can optionally include the bottom surface of the trench of the ferroelectric capacitor disposed on a top surface of a pad of the first metal traces. The bottom surface of the trench of the ferroelectric capacitor includes the insulating sidewall layer and the first electrode layer.

In example 17, the subject matter of any of examples 10-16 can optionally include disposing a hardmask layer on a top surface of the second dielectric layer. The hardkmask layer has a trench opening that exposes a top surface of the second electrode layer of the ferroelectric capacitor.

In example 18, the subject matter of any of examples 10-17 can optionally include the first and second electrode layers which include one or more conductive materials, including ruthenium, tungsten, copper, aluminum, tantalum nitride, titanium nitride, and any combination thereof. The first electrode layer has one or more conductive materials that are similar or different to one or more conductive materials of the second electrode layer. The first electrode has a thickness that is approximately equal to or different than a thickness of the second electrode layer.

Example 19 is a memory device comprising of a semiconductor substrate; a memory array above the semiconductor substrate; and a plurality of ferroelectric capacitors integrated into the memory array. The memory array includes a first dielectric layer over first metal traces. The first metal traces extend along a first direction; second metal traces on the first dielectric layer. The second metal traces extend along a second direction that is perpendicular to the first direction; third metal traces on the second dielectric layer. The third metal traces extend along the first direction; the plurality of ferroelectric capacitors positioned in a plurality of trenches. A trench of the plurality of trenches includes one or more sidewalls and a bottom surface above a first metal trace. The trench has a depth defined from a top surface of the first metal trace to the top surface of the third metal trace; and an insulating sidewall layer, a first electrode layer, a ferroelectric layer, and a second electrode layer disposed in the trench of the ferroelectric capacitor. The trench of the ferroelectric capacitor has a rectangular cylinder shape that is defined by the first, second, and third metal traces.

In example 20, the subject matter of example 19 can optionally include the first metal traces which include pads and lines. The second and third metal traces are adjacent to the one or more sidewalls of the trench of each ferroelectric capacitor. The third metal traces extend along the first direction that is perpendicular to the second direction of the second metal traces.

In example 21, the subject matter of any of examples 19-20 can optionally include a third dielectric layer disposed in between the pads and the lines of the first metal traces; an insulating layer disposed in the trench of each ferroelectric capacitor and surrounded by the second electrode layer; a first etch stop layer on the third dielectric layer and the first metal traces; and a second etch stop layer on the second metal traces.

In example 22, the subject matter of any of examples 19-21 can optionally include the ferroelectric layer surrounded by the first electrode layer and the second electrode layer. The ferroelectric layer includes one or more ferroelectric materials, including HfZrO, Si-doped hafnium oxide, Ge-doped hafnium oxide, Al-doped hafnium oxide, and Y-doped hafnium oxide.

In example 23, the subject matter of any of examples 19-22 can optionally include the bottom surface of trench of the ferroelectric capacitor disposed on a top surface of a pad of the first metal traces. The bottom surface of the trench of the ferroelectric capacitor includes the insulating sidewall layer and the first electrode layer.

In example 24, the subject matter of any of examples 19-23 can optionally include a hardmask layer on a top surface of the second dielectric layer. The hardkmask layer has a plurality of trench openings that exposes top surfaces of the second electrode layers of the plurality of ferroelectric capacitors.

In example 25, the subject matter of any of examples 19-24 can optionally include the first and second electrode layers which include one or more conductive materials, including ruthenium, tungsten, copper, aluminum, tantalum nitride, titanium nitride, and any combination thereof. The first electrode layer has one or more conductive materials that are similar or different to one or more conductive materials of the second electrode layer. The first electrode has a thickness that is approximately equal to or different than a thickness of the second electrode layer.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A memory array, comprising:
a first dielectric layer over first metal traces, wherein the first metal traces extend along a first direction;
second metal traces on the first dielectric layer, wherein the second metal traces extend along a second direction that is perpendicular to the first direction;
third metal traces on a second dielectric layer, wherein the third metal traces extend along the first direction;
a ferroelectric capacitor positioned in a trench, the trench includes one or more sidewalls and a bottom surface above a first metal trace of the first metal traces, wherein the trench has a depth defined from a top surface of the first metal trace to a top surface of a third metal trace of the third metal traces; and
an insulating sidewall layer, a first electrode layer, a ferroelectric layer, and a second electrode layer disposed in the trench of the ferroelectric capacitor, wherein the trench of the ferroelectric capacitor has a rectangular cylinder shape.

2. The memory array of claim 1, wherein the first metal traces include pads and lines, and wherein the second and third metal traces are adjacent to the one or more sidewalls of the trench of the ferroelectric capacitor, and wherein the third metal traces extend along the first direction that is perpendicular to the second direction of the second metal traces.

3. The memory array of claim 2, further comprising a third dielectric layer disposed in between the pads and the lines of the first metal traces.

4. The memory array of claim 3, further comprising:
a first etch stop layer on the third dielectric layer and the first metal traces; and
a second etch stop layer on the second metal traces.

5. The memory array of claim 2, wherein the bottom surface of trench of the ferroelectric capacitor is disposed on a top surface of a pad of the first metal traces, and wherein the bottom surface of the trench of the ferroelectric capacitor includes the insulating sidewall layer and the first electrode layer.

6. The memory array of claim 1, further comprising an insulating layer disposed in the trench of the ferroelectric capacitor and surrounded by the second electrode layer.

7. The memory array of claim 1, wherein the ferroelectric layer is surrounded by the first electrode layer and the second electrode layer, and wherein the ferroelectric layer includes one or more ferroelectric materials, including hafnium zirconium oxide (HfZrO), silicon-doped (Si-doped) hafnium oxide, germanium-doped (Ge-doped) hafnium oxide, aluminum-doped (Al-doped) hafnium oxide, and yttrium-doped (Y-doped) hafnium oxide.

8. The memory array of claim 1, further comprising a hardmask layer on a top surface of the second dielectric layer, wherein the hardkmask layer has a trench opening that exposes a top surface of the second electrode layer of the ferroelectric capacitor.

9. The memory array of claim 1, wherein the first and second electrode layers include one or more conductive materials, including ruthenium, tungsten, copper, aluminum, tantalum nitride, titanium nitride, and any combination thereof, wherein the first electrode layer has one or more conductive materials that are similar or different to one or more conductive materials of the second electrode layer, and wherein the first electrode layer has a thickness that is approximately equal to or different than a thickness of the second electrode layer.

10. The memory array of claim 1, wherein the first and second electrode layers include one or more conductive materials, including ruthenium, tungsten, copper, aluminum, tantalum nitride, titanium nitride, and any combination thereof, wherein the first electrode layer has one or more conductive materials that are similar or different to one or more conductive materials of the second electrode layer, and wherein the first electrode layer has a thickness that is approximately equal to or different than a thickness of the second electrode layer.

11. A method of forming a memory array, comprising:
disposing a first dielectric layer over first metal traces, wherein the first metal traces extend along a first direction;
disposing second metal traces on the first dielectric layer, wherein the second metal traces extend along a second direction that is perpendicular to the first direction;
disposing third metal traces on a second dielectric layer, wherein the third metal traces extend along the first direction;
forming a trench through the third metal traces, the second dielectric layer, the second metal traces, and the first dielectric layer, wherein the trench includes one or more sidewalls and a bottom surface above a first metal trace of the first metal traces, wherein the trench has a depth defined from a top surface of one of the first metal traces to a top surface of one of the third metal traces, and wherein the trench is self-aligned by the third metal traces and the second metal traces; and
disposing an insulating sidewall layer, a first electrode layer, a ferroelectric layer, and a second electrode layer, respectively, into the trench to form a ferroelectric capacitor, wherein the trench of the ferroelectric capacitor has a rectangular cylinder shape.

12. The method of claim 11, wherein the first metal traces include pads and lines, and wherein the second and third metal traces are adjacent to the one or more sidewalls of the trench of the ferroelectric capacitor, and wherein the third metal traces extend along the first direction that is perpendicular to the second direction of the second metal traces.

13. The method of claim 12, further comprising disposing a third dielectric layer in between the pads and the lines of the first metal traces.

14. The method of claim 13, further comprising:
disposing a first etch stop layer on the third dielectric layer and the first metal traces; and
disposing a second etch stop layer on the second metal traces.

15. The method of claim 12, wherein the bottom surface of the trench of the ferroelectric capacitor is disposed on a top surface of a pad of the first metal traces, and wherein the bottom surface of the trench of the ferroelectric capacitor includes the insulating sidewall layer and the first electrode layer.

16. The method of claim 11, further comprising disposing an insulating layer in the trench of the ferroelectric capacitor and surrounded by the second electrode layer.

17. The method of claim 11, wherein the ferroelectric layer is surrounded by the first electrode layer and the second electrode layer, and wherein the ferroelectric layer includes one or more ferroelectric materials, including HfZrO, Si-doped hafnium oxide, Ge-doped hafnium oxide, Al-doped hafnium oxide, and Y-doped hafnium oxide.

18. The method of claim 11, further comprising disposing a hardmask layer on a top surface of the second dielectric layer, wherein the hardkmask layer has a trench opening that exposes a top surface of the second electrode layer of the ferroelectric capacitor.

19. The method of claim 11, wherein the first and second electrode layers include one or more conductive materials, including ruthenium, tungsten, copper, aluminum, tantalum nitride, titanium nitride, and any combination thereof, wherein the first electrode layer has one or more conductive materials that are similar or different to one or more conductive materials of the second electrode layer, and wherein the first electrode layer has a thickness that is approximately equal to or different than a thickness of the second electrode layer.

20. A memory device, comprising:
a semiconductor substrate;
a memory array above the semiconductor substrate; and
a plurality of ferroelectric capacitors integrated into the memory array, wherein the memory array includes
a first dielectric layer over first metal traces, wherein the first metal traces extend along a first direction;
second metal traces on the first dielectric layer, wherein the second metal traces extend along a second direction that is perpendicular to the first direction;
third metal traces on a second dielectric layer, wherein the third metal traces extend along the first direction;
the plurality of ferroelectric capacitors positioned in a plurality of trenches, wherein a trench of the plurality of trenches includes one or more sidewalls and a bottom surface above a first metal trace of the first metal traces, wherein the trench has a depth defined from a top surface of the first metal trace to a top surface of a third metal trace of the third metal traces; and
an insulating sidewall layer, a first electrode layer, a ferroelectric layer, and a second electrode layer disposed in the trench of the ferroelectric capacitor, wherein the trench of the ferroelectric capacitor has a rectangular cylinder shape.

21. The memory device of claim 20, wherein the first metal traces include pads and lines, and wherein the second and third metal traces are adjacent to the one or more sidewalls of the trench of each ferroelectric capacitor, and wherein the third metal traces extend along the first direction that is perpendicular to the second direction of the second metal traces.

22. The memory device of claim 21, further comprising:
a third dielectric layer disposed in between the pads and the lines of the first metal traces;
an insulating layer disposed in the trench of each ferroelectric capacitor and surrounded by the second electrode layer;
a first etch stop layer on the third dielectric layer and the first metal traces; and
a second etch stop layer on the second metal traces.

23. The memory device of claim 22, wherein the bottom surface of trench of the ferroelectric capacitor is disposed on a top surface of a pad of the first metal traces, and wherein the bottom surface of the trench of the ferroelectric capacitor includes the insulating sidewall layer and the first electrode layer.

24. The memory device of claim 20, wherein the ferroelectric layer is surrounded by the first electrode layer and the second electrode layer, and wherein the ferroelectric layer includes one or more ferroelectric materials, including HfZrO, Si-doped hafnium oxide, Ge-doped hafnium oxide, Al-doped hafnium oxide, and Y-doped hafnium oxide.

25. The memory device of claim 20, further comprising a hardmask layer on a top surface of the second dielectric layer, wherein the hardkmask layer has a plurality of trench openings that exposes top surfaces of the second electrode layers of the plurality of ferroelectric capacitors.

* * * * *